United States Patent [19]
Reed

[11] Patent Number: 5,140,283
[45] Date of Patent: Aug. 18, 1992

[54] TIME VARIANT ANALOG SIGNAL SWITCHING APPARATUS INCLUDING SWITCHING TRANSIENT AVOIDANCE

[76] Inventor: Lockwood W. Reed, 1 Van Schoick Rd., Middletown, N.J. 07748

[21] Appl. No.: 739,888

[22] Filed: Aug. 2, 1991

[51] Int. Cl.$^5$ .................. H03G 3/30; H03K 17/16
[52] U.S. Cl. .................. 330/284; 307/542; 330/144; 330/149
[58] Field of Search .............. 330/86, 144, 145, 282, 330/284, 149; 307/542, 542.1

[56]  References Cited
U.S. PATENT DOCUMENTS 3,500,316  3/1970  Brown ...................... 330/86
4,628,276  12/1986  Mitzutani ................. 330/86
4,683,386  7/1987  Kawara ..................... 307/549
4,918,397  4/1990  Kidger ...................... 330/86

FOREIGN PATENT DOCUMENTS 133808  6/1987  Japan ...................... 330/282

Primary Examiner—James B. Mullins

[57]  ABSTRACT

A time variant signal switching circuit that includes circuitry (303 and 304) that detects prescribed zero crossings and restricts switch state changes of a switch complex (305) to those prescribed times the time variant signal is at zero. By restricting switch state changes to prescribed zero crossings voltage transients due to the switching action are avoided.

9 Claims, 4 Drawing Sheets

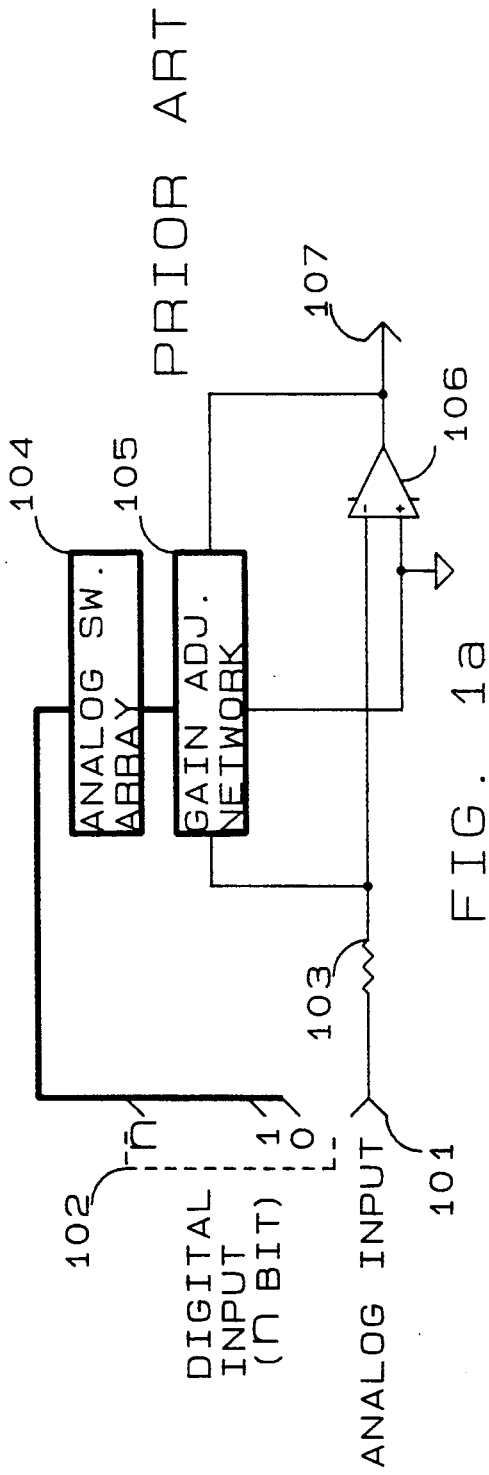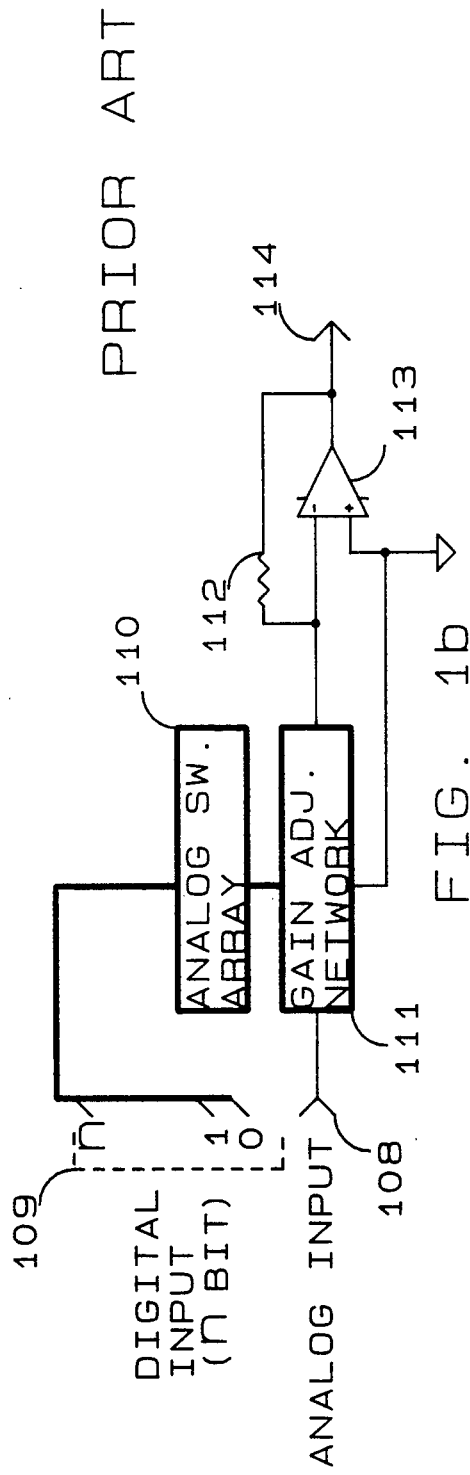

TIME VARIANT ANALOG SIGNAL SWITCHING APPARATUS INCLUDING SWITCHING TRANSIENT AVOIDANCE

1. Field of the Invention

The subject invention relates to the field of electronics. The subject invention has application to digitally controlled circuits and is particularly effective in gain control applications. The use of gain control has many applications. The audio recording industry in particular, relies heavily on acoustic signal processing that includes gain control. To be acceptable the acoustic signal processing must be of the highest quality minimizing distortion and spurious voltage transients.

2. Description of Prior Art

One of the simplest and oldest forms of gain control employs a R-2R ladder network in combination with digitally controlled analog switches and operational amplifiers. The R-2R ladder network approach will be used to illustrate the utility of the invention. It should be noted that the invention has application to gain control techniques other than the R-2R form, such as that of Brown (3,500,316) and Kamikawara (4,683,386). More generally the invention addresses the voltage transients which can occur in any application which involves the switching of a time variant analog signal of the type defined later in this specification. The inherent nature of gain control techniques, which utilize any form of switching apparatus, to generate spurious voltage transients during gain changes has limited their use in high quality audio processing applications. A typical form of such a gain control technique is the R-2R ladder network which usually employs some form of analog switch to alter the configuration of the R-2R network and hence affect a gain change. Examples of the R-2R ladder network approach to gain control can be found in Kidger (4,918,397) and Mizutani (4,628,276). The fact that switching transients can occur in gain control circuits is illustrated in Kamikawara. Kamikawara teaches that switching transients can occur and his invention addresses this problem. Kamikawara approach to overcome the switching transient is to mute the output during the switching intervals. This approach, however, creates a discontinuity in the output signal(as illustrated in Kamikawara FIG. 4 and FIG. 6) which itself will generate spurious noise. I will be shown that the art of Brown, Kidger, Mizutani and Kamikawara will generate spurious voltage transients during gain changes and that the subject invention overcomes the deficiencies of the prior art.

SUMMARY OF THE INVENTION

An objective of the subject invention is to avoid the generation of spurious voltage transients inherent in any operation which involves the switching of a time variant analog signal.

A further objective of the subject invention is to avoid the generation of spurious voltage transients inherent in the operation of switched gain control circuits. The purpose of said gain control circuits is to affect gain changes to analog signals.

The reference in this specification to an analog signal(s) shall mean any analog signal which is time variant and cyclical in nature, periodically alternating in amplitude from zero to at least a nominal deviation from zero. This definition shall include an alternating current signal in which the amplitude periodically alternates between positive and negative polarities passing through zero.

According to the subject invention a voltage transient avoidance apparatus comprises a detector that detects prescribed nominal deviations in amplitude from zero of an analog signal, a synchronizer that produces a switch state signal the value of which is set equal to the value of a discrete signal at times prescribed by said detector and a switch complex the state of which is prescribed by said switch state signal. Further, according to the subject invention as applied to gain control, a gain control apparatus comprises the said voltage transient avoidance apparatus and a level adjuster that produces an output signal which is substantially equal to said analog signal except for the amplitude, which is adjusted as prescribed by state of said switch complex.

In accordance with a feature of the subject invention, the said detector may comprise a zero crossing detector. A preferred embodiment of the zero crossing detector comprises a threshold detector that attains a first state when said analog signal is nominally positive in amplitude and attains a second state when said analog signal is nominally negative or zero in amplitude.

In accordance with another feature of the subject invention, the preferred embodiment of the said synchronizer comprises a first data register connected to a discrete signal source. Data output from the discrete signal source is stored in the first data register according to prescribed schedule. The second data register is connected to the output of the first data register. The data from the first data resister is stored in the second data register a times prescribed by said detector. The output of the second data register produces the said switch state signal.

In accordance with another feature of the subject invention, the said switch complex comprises a plurality of switches.

In accordance with still another feature of the subject invention, an preferred embodiment of the said level adjuster includes a resistive network. The said switch complex alters the configuration of the resistive network. The configuration of the resistive network determines the gain of the said level adjuster. The state of the switch complex is prescribed by the said switch state signal. A preferred embodiment of the resistive network is of the type known as an R-2R ladder network.

BRIEF DESCRIPTION OF THE DRAWINGS

The subject invention will be described in further data referencing the accompanying drawings in which:

FIG. 1a is a diagram of prior art illustrating the use of gain adjustment network in the feedback path of an operational amplifier.

FIG. 1b is a diagram of prior art illustrating the use of a gain adjustment network in the input path of an operational amplifier.

DESCRIPTION OF PRIOR ART INCLUDING DEFICIENCIES

Figure 2B:
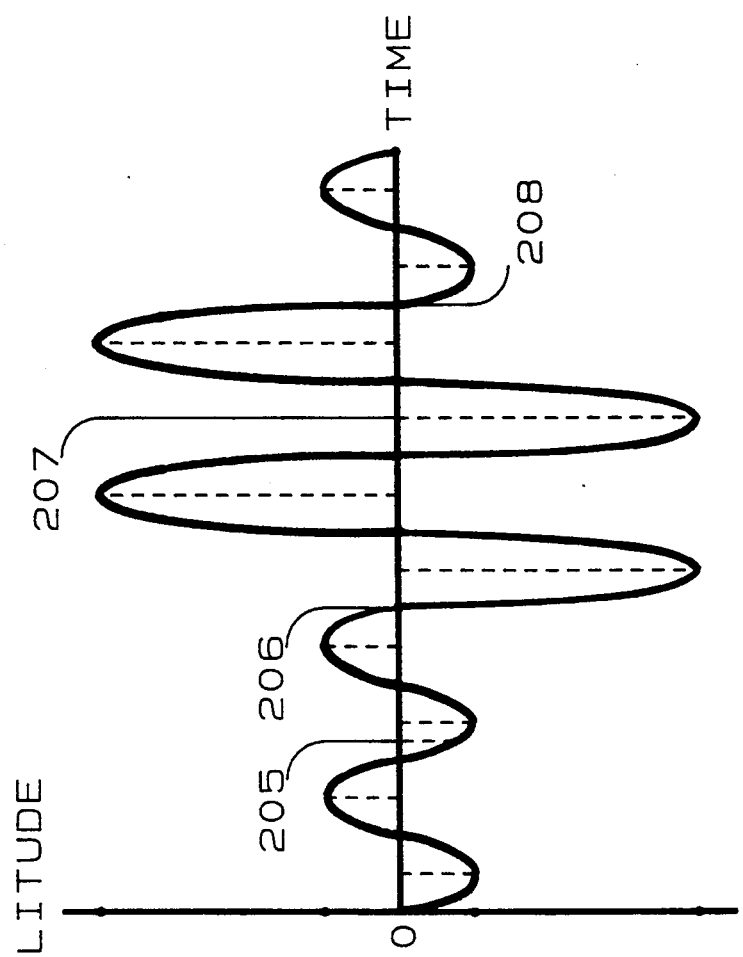
FIG. 2b is a diagram illustrating how the subject invention avoids the generation of voltage transients.

Referring to FIG. 1a of the drawings that shows a typical prior art gain control circuit similar to the type taught by Mizutani, Kidger and Brown in which the gain adjustment network 105 is located in the feedback path of the operational amplifier 106. The gain adjustment network 105 could be of the resistive type, more specifically it could be R-2R ladder network. Element 104 could represent an array of digitally controlled analog switches. In the circuit of FIG. 1a the gain of the circuit is given by the equation $$GAIN(a) = -Req105/Rin103.$$

where Req105 is the equivalent resistance of the gain adjustment network 105 and Rin103 is the value of resistive element 103 in the input path of operational amplifier 106. The minus sign indicates the phase inversion of operational amplifier 106.

The gain of the circuit illustrated in FIG. 1a is changed by altering the configuration of gain adjustment network 105 (and hence the equivalent resistance Req105) which is determined by the state of the digitally controlled analog switch array 104. The state of digitally controlled analog switch array 104 is determined by the bit pattern applied to the digital input 102. The signal output at 107 (Vout(a)) would thus be specified by the equation $$Vout(a) = GAIN(a)*Vin(a)$$

where Vin(a) is the analog signal applied to the analog input 101.

Figure 2A:
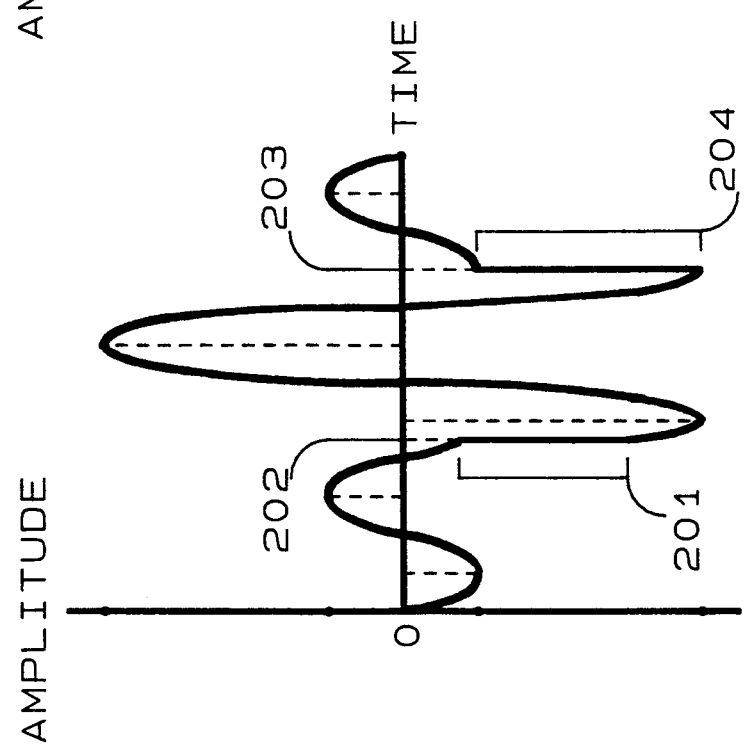
FIG. 2a is a diagram illustrating how voltage transients are generated in prior art.

The circuit of FIG. 1b operates in a manner similar to that of FIG. 1a with the exception that the gain adjustment network 111 is located in the input path of operational amplifier 113. Element 110 could be an array of digitally controlled analog switches. As in FIG. 1a gain adjustment network 111 could be of the resistive type, more specifically it could be an R-2R ladder network. Because active gain adjustment network 111 is in the input path the gain equation changes to $$GAIN(b) = -Rf112/Req111$$

where Rf112 is the value of resistive element 112 in the feedback path of operational amplifier 113 and Req111 is the equivalent resistance of gain adjustment network 111. The minus sign indicates the phase inversion of operational amplifier 113. The gain of the circuit of FIG. 1b is changed by altering the configuration of gain adjustment network 111(and hence the equivalent resistance Req111) and is determined by the state of digitally controlled analog switch array 110. The state of digitally controlled analog switch array 110 is determined by the bit pattern applied to digital input 109. The signal output at 114 (Vout(b)) would thus be specified by the equation $$Vout(b) = GAIN(b)*Vin(b)$$

where Vin(b) in the analog signal applied to analog input 108. The circuits illustrated in FIG. 1a and FIG. 1b inherently generate spurious voltage transients because changes in the bit patterns applied to the respective digital inputs 102 or 109 occur asynchronously with respect to the analog signal applied to the respective analog inputs 101 or 108. FIG. 2a illustrates the effect of two arbitrary gain changes occurring a times 202 and 203 which result in two corresponding voltage transients 201 and 204. Because the changes in gain in the circuits of FIG. 1a and FIG. 1b occur almost instantaneously, voltage transients 201 and 204 appear as abrupt step function like level changes. The general equation to determine the magnitude of the voltage transient at either output 107 or 114 is given by the equation $$VT(t) = v(t)*dGAIN(t)$$

where VT(t) is the magnitude of the voltage transient at time t, v(t) is the instantaneous input voltage at 101 or 108 corresponding to time t, and dGAIN(t) is the change in gain corresponding to time t. Because a gain change can occur arbitrarily the magnitude of the voltage transient is a multiplication of the instantaneous input voltage by the change in gain. Voltage transients of the type illustrated in FIG. 2a will generate numerous harmonics and produce an audible distortion of the source material.

DETAILED DESCRIPTION OF SUBJECT INVENTION

Figure 3:
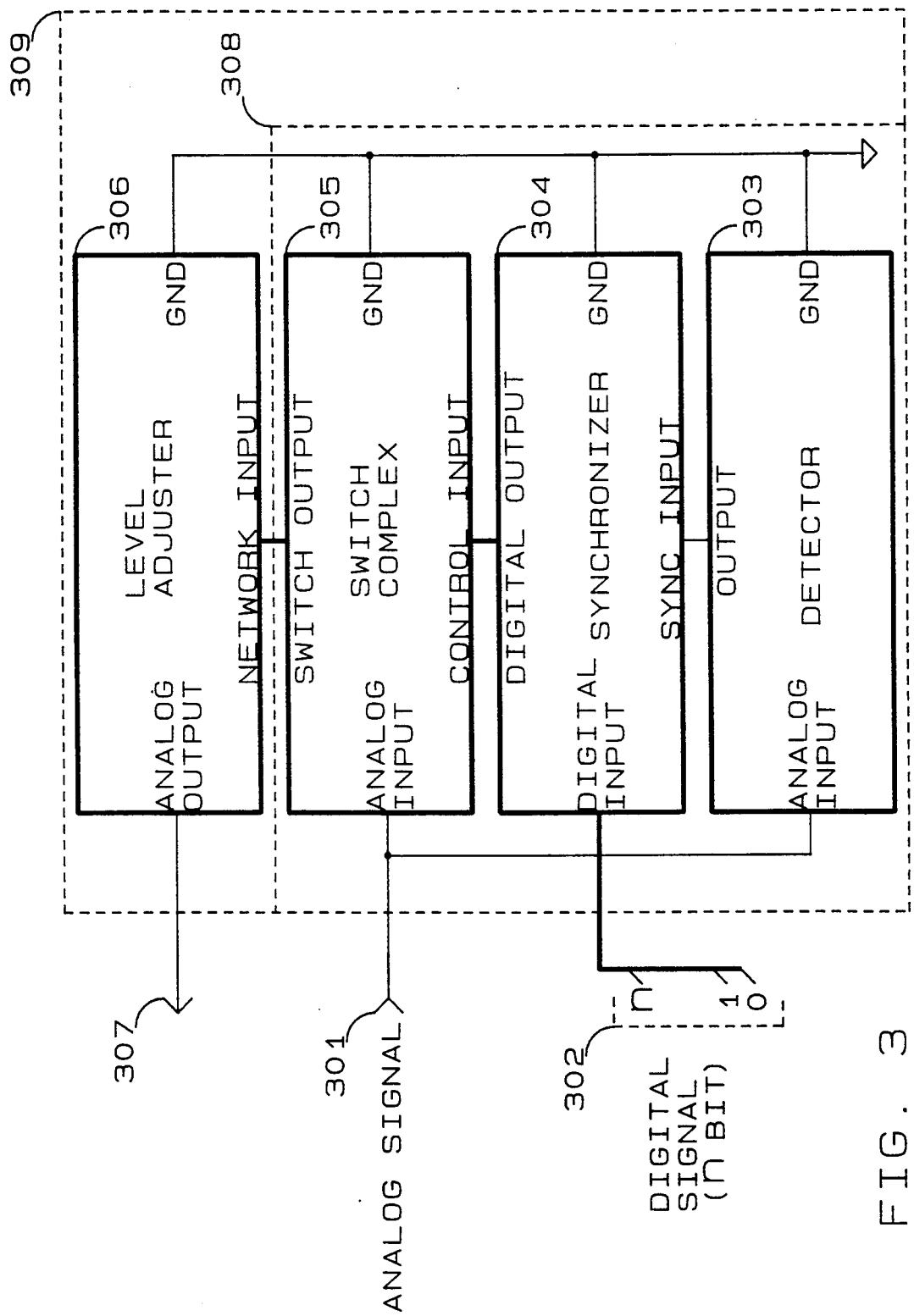
FIG. 3 is a block diagram illustrating the major components of the subject invention for both it's general form and in it's gain control application.
Figure 4:
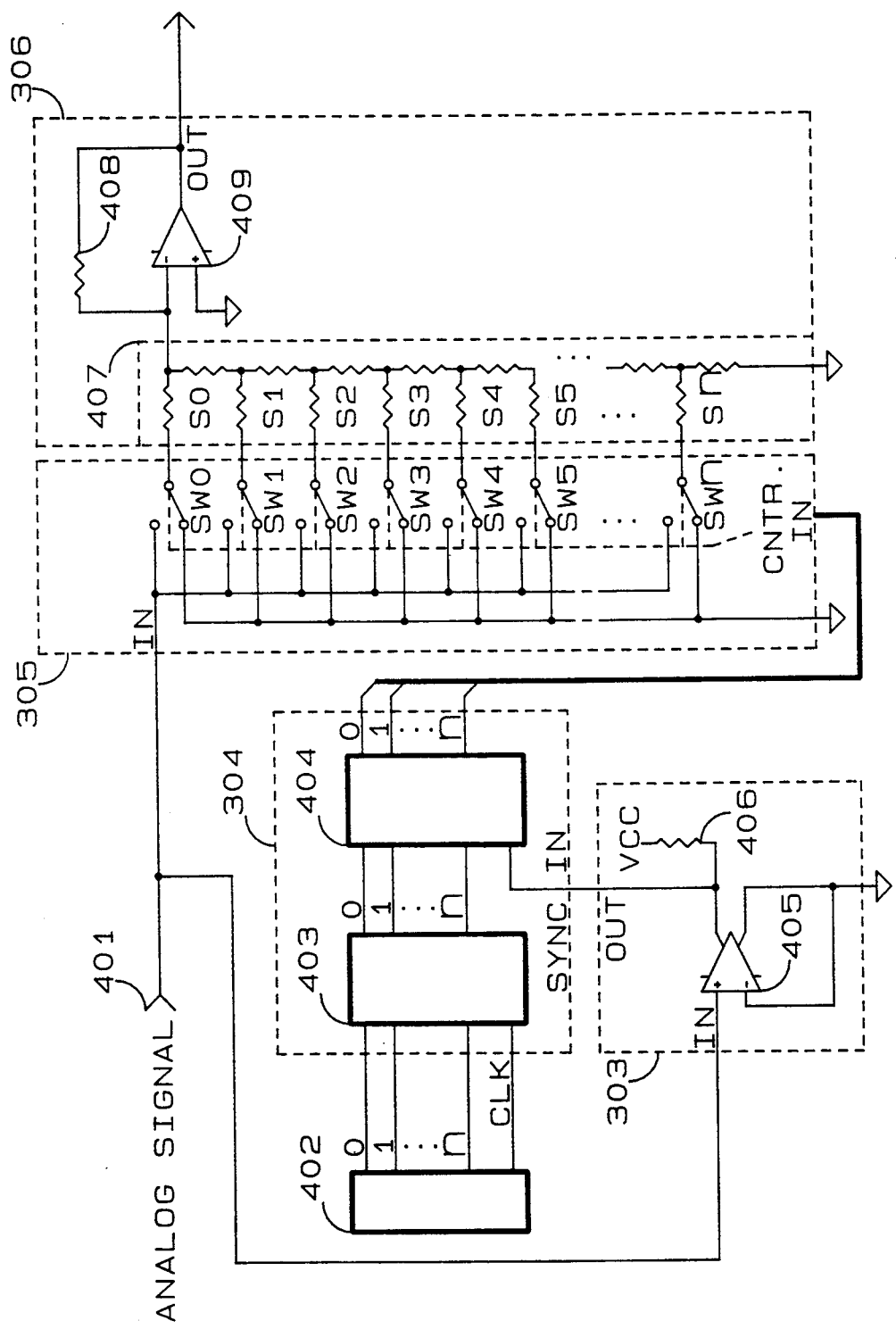
FIG. 4 is a diagram of the preferred embodiment of the subject invention.

The following discourse will describe the subject invention in detail and show how the subject invention overcomes the deficiencies of the prior art stated above. The major components of the subject invention are illustrated in FIG. 3 and the preferred embodiment is illustrated in FIG. 4. The inherent transient free performance of the subject invention is illustrated in FIG. 2b.

Referring to FIG. 3, the general form of the subject invention, which shall be referred to as switching transient avoidance apparatus 308, comprises detector 303 having an ANALOG INPUT and an OUTPUT, synchronizer 304 having an "n" bit DIGITAL INPUT, a SYNC INPUT and an "n" bit DIGITAL OUTPUT and switch complex 305 having a CONTROL INPUT, an ANALOG INPUT and an 'm' pole SWITCH OUTPUT. An analog signal applied to input 301 appears at the ANALOG INPUT of detector 303. At prescribed times when the analog signal at input 301 passes thru zero, a detection signal is output from the OUTPUT of detector 303 to the SYNC INPUT of synchronizer 304. The receipt of the detection signal by synchronizer 304 initiates the transfer of the value of the digital signal at input 302 to the DIGITAL OUTPUT of synchronizer 304 where it remains stable until the receipt of the next detection signal. The signal that appears at the DIGITAL OUTPUT of synchronizer 304 is the said switch state signal which is applied to the CONTROL INPUT of switch complex 305. The said switch state signal prescribes the state of the each of the plurality of switches which comprise switch complex 305. The state of switch complex 305 is a function of the individual states of the plurality of switches of which it is comprised. The analog signal at input 301 is additionally applied to the ANALOG INPUT of switch complex 305 and appears at a combination of the "m" poles of the SWITCH OUTPUT of switch complex 305 as prescribed by the said switch state signal. Because the changes in the state of switch complex 305 are synchronized to occur coincident with prescribed times when the amplitude of the analog signal applied to input 301 is zero, switching transients at the SWITCH OUTPUT of switch complex 305 are avoided.

Referring again to FIG. 3, the subject invention as applied to gain control, which shall be referred to as switched gain control apparatus 309, comprises switching transient avoidance apparatus 308 and level adjuster 306 having an ANALOG OUTPUT and an "m" bit NETWORK INPUT. Level adjuster 306 adjusts the gain of the analog signal at input 301, as prescribed by the state of switch complex 305, via the connection of the SWITCH OUTPUT of switch complex 305 to the NETWORK INPUT of level adjuster 306. The gain adjusted analog signal appears at the ANALOG OUTPUT of level adjuster 306. Again because the changes in the state of switch complex 305 are synchronized to occur coincident with prescribed times when the amplitude of the analog signal applied to input 301 is zero, switching transients at the SWITCH OUTPUT of switch complex 305 are avoided and hence the resulting gain changes prescribed by the corresponding state changes of switch complex 305 do not generate spurious voltage transients. A further understanding of the subject invention can be obtained through a comparison of the block diagram of FIG. 3 to the preferred embodiment of FIG. 4. The preferred embodiment of detector 303 comprises threshold detector 405 and resistor 406, where the output of threshold detector 405 corresponds to the OUTPUT of detector 305. The preferred embodiment of synchronizer 304 comprises data registers 403 and 404 each having "n" digital inputs and outputs, where the SYNC INPUT of synchronizer 304 corresponds to the CLK input of data register 404. The preferred embodiment of switch complex 305 comprises an analog switch array of "n" switching elements (SW0−SWn), where the signal at the CONTROL INPUT of switch complex 305 prescribes the states of SW0 thru SWn. The preferred embodiment of level adjuster 306 comprises ladder network 407 having "n" stages (S0−Sn), feedback resistor 408, and operational amplifier 409. Apparatus 402 represents a source of digital data such as a microcontroller. An analog signal applied to input 401 is adjusted in amplitude through the action of switch complex 305 on ladder network 407. The amplitude adjusted signal appears at output 410. The amplitude adjustment or gain is given by equation $$GAIN = Rf408/Req407$$

where Rf408 is the value of feedback resistor 408 and Req407 is the equivalent resistance of ladder network 407. Switch complex 305 alters the value Req407 by switching selected resistances of ladder network 407 either to the source of the analog signal or to signal ground. The signal output from data register 404 to the CONTROL INPUT of switch complex 305 determines the state of switches SW0 thru SWn, and hence the value Req407.

Apparatus 402 outputs a digital signal to the input of data register 403. The digital signal output by apparatus 402 will ultimately determine the state of switch complex 305. When the digital signal is stable at the input of data register 403 apparatus 402 outputs a clocking signal to the CLK input of data register 403. The rising edge of the clocking signal at the CLK input of data register 403 causes the value of the digital signal at the input of data register 403 to be stored in and appears at the output of data register 403. The output of data register 403 is connected to the input of data register 404 and hence the value of the digital signal at the output of data register 403 appears at the input of data register 404. On the rising edge of the detection signal applied to the CLK input of data register 404 the value of the digital signal at the input of data register 404 is stored in and appears at the output of data register 404. The detection signal is produced at the output of threshold detector 405. Due to the high gain of threshold detector 405 the rising edge detection signal is produced when the analog signal, at the non-inverting input of threshold detector 405, becomes nominally positive in magnitude(nominally positive is defined as the analog signal nominally deviating from zero amplitude with a positive slope). The value of the digital data at the output of data register 404 prescribes the state of switch complex 305 and hence the value Req407.

It is evident that by restricting state changes of switch complex 305 to prescribed times when the amplitude of the analog signal is virtually zero the voltage transients due to the change of state of switch complex 305 are avoided. This is illustrated in FIG. 2b which shows the gain adjusted analog signal at output 410 (it should be noted that due to the phase reversal of operational amplifier 409 the signal at output 410 is 180 degrees out of phase with the analog signal at input 401). At time 205 apparatus 402 outputs a gain change digital signal which is stored in data register 403(Prior art would implement the gain change immediately producing a voltage transient as illustrated at time 202 of FIG. 2a ). The subject invention does not actualize the gain change until threshold detector 405 outputs the detection signal signifying that the analog signal has reached time 205 where it's amplitude is virtually zero with a negative slope(negative slope due to 180 phase shift of operational amplifier 409). At time 205 the gain change is implemented by transferring the value of the said gain change digital signal stored in data register 403 to data register 404. The output of data register 404 determines the state of switch complex 305 and hence the gain of level adjuster 306. Similarly when apparatus 402 outputs another gain change digital signal at time 207 the subject invention does not actualize the gain change until time 208 where the amplitude of the analog signal at output 410 is virtually zero with a negative slope.

To reduce circuit complexity a simple threshold detector was illustrated in the preferred embodiment of the subject invention. A simple threshold detector results in a gain change implementation delay of up to one full cycle of the analog signal. It should be obvious to anyone skilled in the art that threshold detector illustrated in the subject invention could be replaced with a true zero crossing detector which would reduce the maximum gain change implementation delay from one full cycle to one half cycle of the analog signal.

It should also be obvious to anyone skilled in the art that level adjuster illustrated in the preferred embodiment of the subject invention represents only one form and that the gain change techniques of the subject invention are applicable to many forms of level adjuster including the forms illustrated in the cited prior art.

Many applications of gain control require that the output from a single signal source be distributed to a plurality of destinations much like a tree structure where the trunk represents the signal source which then branches to many destinations. It would not be uncommon in such signal branching applications to require a different level of attenuation in each branch. An example of such an application would be an audio mixing board used by the audio recording industry. It would be obvious to anyone skilled in the art that only a single detector would be required per unique signal source. Each point of attenuation of a single tree would require a synchronizer, a switch complex and a level adjuster. The single detector would sense the signal at the trunk of the tree and the output of the detector would be connected to each synchronizer of the same tree. The invention anticipates that only one detector is required per unique signal source which can save circuitry in many signal branching applications.

What is claimed is:

1. A method of accomplishing the transient free switching of an analog signal, comprising the steps of:
   providing an analog signal having a cyclical nature where by the amplitude of said analog signal periodically alternates in magnitude between zero and at least a nominal deviation from zero,
   providing a discrete signal, detecting prescribed nominal amplitude deviations from zero of said analog signal,
   producing a switch state signal which equals the value of said discrete signal at a time corresponding to the last said prescribed detection of nominal amplitude deviation from zero of said analog signal,
   setting the state of each of a plurality switches as prescribed by said switch state signal.

2. A method of accomplishing the transient free adjustment in amplitude of an analog signal, which comprises the method recited in claim 1 and further includes the steps of:
   producing an output signal which is substantially equal to said analog signal,
   adjusting the amplitude of said output signal as prescribed by the states of said plurality of switches.

3. An apparatus for accomplishing the transient free switching of an analog signal, comprising:
   an analog signal source which produces an analog signal having a cyclical nature where by the amplitude of said analog signal periodically alternates between zero and at least a nominal deviation from zero,
   a discrete signal source which produces a discrete signal,
   a detector for producing a detection signal that changes state upon the detection of prescribed nominal amplitude deviations from zero of said analog signal,
   a synchronizer for producing a switch state signal which equals the value of said discrete signal at a time corresponding to the last state change of said detection signal,
   a plurality of switches the states of which are prescribed by said switch state signal.

4. An apparatus for accomplishing the transient free adjustment in amplitude of an analog signal, which comprises
   the apparatus recited in claim 3 and further includes:
   a level adjuster for producing an output signal that is substantially equal to said analog signal where the amplitude of said output signal is adjusted by said level adjuster to a value prescribed by the states of said plurality of switches.

5. An apparatus, as recited in claim 4, wherein said level adjustment means comprises an R-2R ladder network, a first resistor and an operational amplifier, where the gain of the said apparatus is determined by the ratio of said first resistor, in the feedback loop of the said operational amplifier, to equivalent resistance of the R-2R network connected to the input of said operational amplifier, the equivalent resistance being determined by the state of each of said plurality of switches connected to the said R-2R network, where the control input of said plurality of switches is connected to the output of, and receives data from said synchronization means which prescribes the state of each of said plurality of switches.

6. An apparatus, as recited in claim 3, wherein said discrete signal source comprises a source of binary data such as a microprocessor.

7. An apparatus, as recited in claim 3, wherein said detector comprises a zero crossing detector.

8. An apparatus, as recited in claim 3, wherein said detector comprises a voltage threshold detector.

9. An apparatus, as recited in claim 3, wherein said synchronizer comprises, a first data register connected to the output of said discrete signal source, which stores data output from said discrete signal source according to a prescribed schedule, and a second data register connected to the output of said first data register which stores data output from said first data register as prescribed by said detection signal, the output of said second data register is connected to said plurality of switches and the data output from said second register prescribes the state of each of said plurality of switches.

* * * * *